Jan. 10, 1967 T. B. WRIGHT 3,297,916

FASTENER AND HEAT CONDUCTOR INSTALLATION

Filed Jan. 5, 1965

Inventor:
Thomas B. Wright,
by Philip E. Parker
Atty.

United States Patent Office 3,297,916

Patented Jan. 10, 1967

3,297,916

FASTENER AND HEAT CONDUCTOR INSTALLATION

Thomas B. Wright, Oakland, Calif., assignor to United-Carr Incorporated, Boston, Mass., a corporation of Delaware Filed Jan. 5, 1965, Ser. No. 423,421

6 Claims. (Cl. 317—100)

The invention relates generally to devices for mounting electric components, in particular, transistors, on printed circuit boards and other supporting panels or chassis.

More specifically the invention concerns a novel clip and clip and heat sink combination which contributes to greater efficiency in terms of the speed with which components may be mounted and is per se adapted to accommodate printed circuit boards and/or supporting panels of diverse thicknesses.

Those having familiarity with the art will appreciate that electrical components, particularly certain types of translators, generate considerable heat when energized, and more importantly in this instance that there are many varieties of heat conductors commonly known as heat "sinks," and heat dissipators employed to alleviate this problem. With respect to the former the same persons will also be aware that in most previously known heat sinks the body of the sink is provided with a threaded stud which is passed through an apertured supporting panel and secured thereto by applying a nut, usually a nylon nut, to the threaded portion. Heat sinks of this type are often insulated from a supporting panel by a mica washer or by hard anodizing the aluminum which is commonly used in heat sink production. Further the electrical component (transistor) is in most instances retained in a cavity in the body of the heat sink by the use of an epoxy cement.

It is submitted that a comparison of the type of heat sink and means of attachment discussed above with the device disclosed herein renders the present invention's novel contribution to the art quite evident. Primarily, of course, it is seen that the present device provides a substantially more efficient assembly in that the threaded stud and nut combination is replaced by a simple, stamped, metal spring clip which greatly reduces the time required to secure the heat sink. In this connection it would be well to emphasize that by providing a series of notches on the body of the heat sink the advantages of a single sink and fastener which will accommodate panels of different thicknesses is retained.

Further by utilizing an internal self-retaining spring to secure a component in the heat sink in lieu of epoxy cement better heat transfer is obtained and the over-all assembly is accomplished in a cleaner and more efficient manner.

Thus, an object of the invention is to provide a highly efficient, inexpensive fastener for securing a heat conductor to a supporting panel.

A further object is to provide a novel heat sink and fastener combination to facilitate speedy attachment of the heat sink to a supporting panel.

An additional object is to provide a heat sink and fastener combination which results in improved heat transfer between an electrical component, the heat sink, and a supporting panel.

A still further object of the invention is to provide a combination heat conductor and fastener which is adapted to be secured to supporting panels of different thicknesses in a speedy, highly efficient manner.

Other objects and advantages of the novel fastener and fastener and heat sink combination will become evident from a reading of the following detailed description in conjunction with a viewing of the accompanying drawings, in which.

Figures 1, 2, 3, 4, 5, 6, 7:
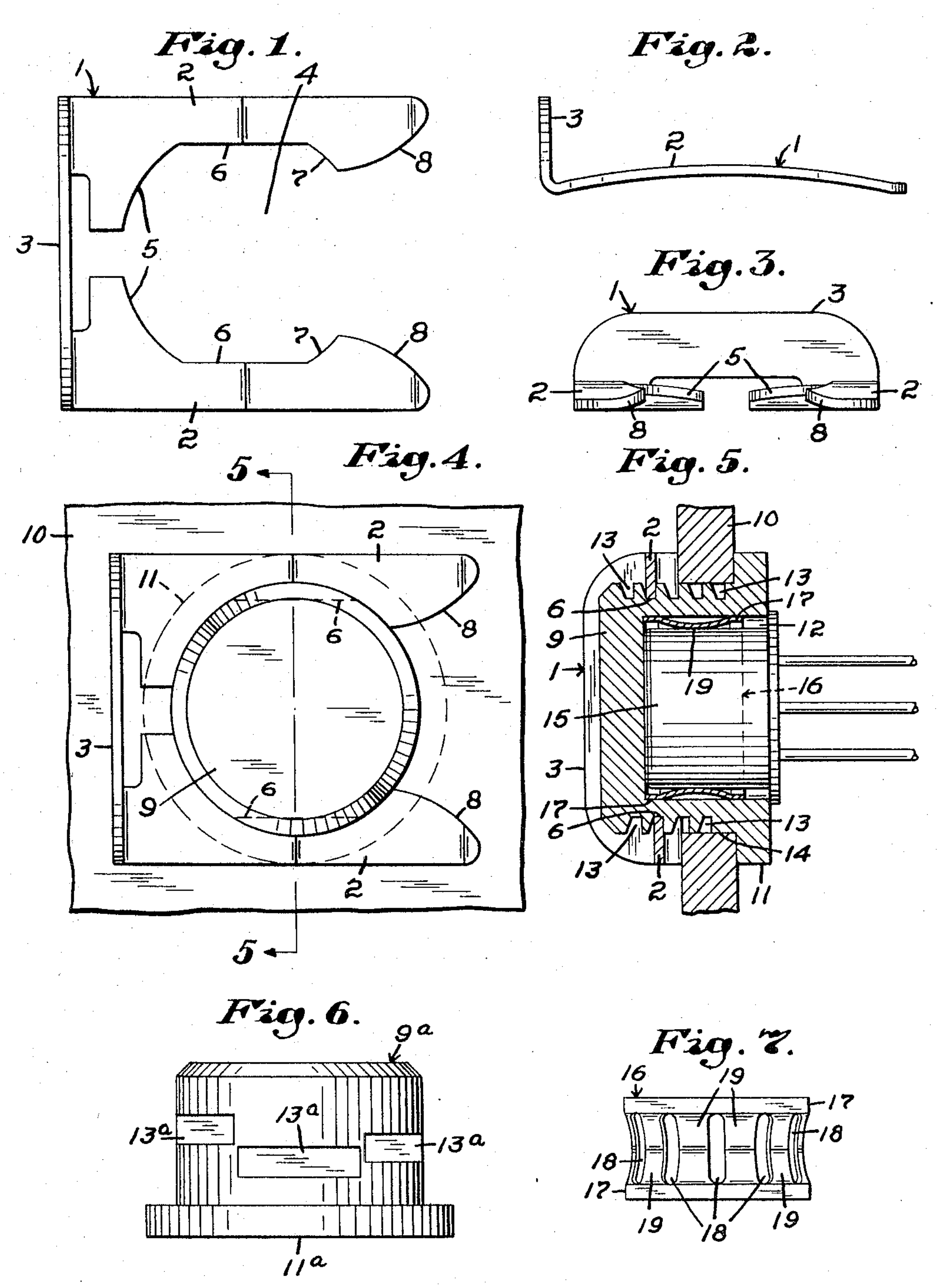
FIG. 1 is a top plan view of the fastener.
FIG. 2 is a side elevation of the fastener.
FIG. 3 is an end view of the fastener as seen from the right of FIG. 2.
FIG. 4 is a top plan view of an installation depicting the fastener securing the heat sink to a supporting panel.
FIG. 5 is a section taken on line 5—5 of FIG. 4 showing a transistor (in full) retained in the heat sink by a circumferentially disposed spring.
FIG. 6 is a side elevation of a modified form of the heat sink.
FIG. 7 is a side elevation of the spring shown in FIG. 5.

The fastener 1 shown in FIGS. 1, 2, and 3 in the form of a simple, metal stamping includes a pair of generally parallel, spaced spring fingers 2 integrally joined to and extending outwardly at substantially right angles from a flange 3.

The internal edges of the spring fingers 2 define a slot 4 for receiving a heat conductor or heat sink and are contoured beginning at the end of the slot closest to the flange 3 to include diverging portions 5, substantially parallel, straight portions 6, converging portions 7, and diverging lead-in portions 8.

As best shown in FIG. 2 each of the spring fingers 2 is bowed or arcuately profiled for purposes to be described more fully hereinafter.

It is also contemplated that the internal edges of each of the spring fingers shown as portions 5, 6, and 7 might be made continuously arcuate so as to defined an oval, elliptical or circular slot without departing from the scope of the invention or detracting from the efficiency of the fastener.

FIGS. 4 and 5 depict an installation wherein the fastener 1 is employed to secure a heat sink 9 to a supporting panel, for example, a metal chassis 10.

The heat sink 9 has a circumferential flange 11 disposed about one end thereof and an internal cavity 12 opening at the end adjacent said flange. The exterior of the heat sink 9 beyond the flange is provided with a plurality of notches 13 at different levels, in this instance depicted in the form of buttress-type threads.

In assembling the heat sing 9 to the panel 10 the notched or threaded portion is first passed through an aperture 14 in the panel, such that the flange 11 abuts the undersurface (or left side as viewed in FIG. 5) of the panel. The clip 1 is thereafter forced into engagement with the heat sink by applying pressure to the rear (left) of the flange 3 causing the spring fingers 2 to spread laterally until the sink seats in the slot 4. At this point the fingers 2 snap back to their normal position to securely engage the heat sink.

As best shown in FIG. 5 the internal edge portions 6 seat in the notches 13 such that the spring fingers 7, due to their bowed or arcuately profiled configuration, exert a continuous force on the heat sink normal to the panel 10 thus drawing the flange 11 tightly against the panel to provide improved heat transfer.

For purposes of illustration a transistor 15 is shown seated in the cavity 12 and retained therein by a circumferentially disposed spring 16.

The spring 16 is a split, circular band of beryllium copper having upper and lower peripheral straight edges 17 and an inwardly bowed midsection between said edges.

The midsection 18 is slotted at equally spaced intervals to provide a plurality of laterally flexible ribs 19.

To secure the spring 16 to the heat sink 9 the former is manually compressed and forced into the cavity 12. Thereafter the spring retains itself in the cavity 12 by reason of the tension it exerts on the internal walls of the heat sink. Further consideration of FIG. 5 indicates that the straight peripheral edges 17 are tensioned against the walls of the cavity 12; whereas the flexible ribs 19 are spaced from the heat sink. Thus upon insertion of the component 15 the latter is frictionally engaged by the ribs 19 and retained in position by the circumferential pressure exerted thereon by the ribs.

The reader will appreciate that the utilization of the novel spring as a means of securing a component in the heat sink, further increases the over-all efficiency of the installation as a subassembly of an electrical apparatus. Specifically the spring being of beryllium copper, an excellent heat conductor, provides a path for the transfer of heat from the component to the heat sink which an epoxy cement or other suitable adhesive does not provide. When viewed from another aspect it becomes evident that a technician may immediately perform other work on the component, for example, soldering of the leads to terminal posts without any unnecessary delay to allow for setting or curing of cements or adhesives. Additionally the spring makes for a cleaner over-all assembly as compared with adhesives which often oozed out of the cavity and became adhered to the exterior of the heat sink and component. Lastly, of course, removal of the component from the heat sink and subsequent replacement thereof becomes a simple operation.

It is significant to note that the provision for a plurality of notches 13 at different levels on the heat sink 9 renders a single clip adaptable for securing the sink to a variety of panels having diverse thicknesses. Further, regardless of the panel thickness the arcuately profiled configuration of the spring fingers will cause the latter to exert a force normal to the heat sink which will draw the flange 11 tightly against the panel.

In the present illustration the notches 13 have been depicted in the form of external buttress-type threads since this arrangement results in particular, practical advantages. Whereas the threads are continuous around the periphery of the heat sink, the clip can be applied from any direction; and should the clip not secure the heat sink as tightly as desired, a quarter turn of the clip will cinch the flange 11 up against the panel 10.

A modified form of the heat sink 9*a* having a peripheral flange 11*a* is depicted in FIG. 6. In this instance the sink is provided with distinct, staggered notches 13*a* at different levels. FIG. 6 clearly discloses three of the distinct notches and of course three additional notches at identical levels are provided on the remote side of the heat sink which is hidden in the referenced figure.

Many other means of providing the notches are contemplated; for example, standard Acme square or V form threads, or by scoring or knurling the outer wall of the heat sink. Regardless of how the clip engaging means are provided, however, the invention retains the aforementioned advantages of speedy, efficient attachment and adaptability for use on a wide range of panel thicknesses.

With reference to the foregoing description it is to be clearly understood that what has been disclosed therein represents only a single embodiment of the invention and is to be construed as illustrative rather than restrictive or limiting in nature; the scope of the invention being best defined by the following claims.

What is claimed:

1. A sheet metal clip particularly adapted for securing a flanged member to an apertured supporting panel comprising a pair of spaced, generally-parallel spring fingers integrally joined at substantially right angles to an upstanding flange, said spring fingers having internal profiled edges having substantially different adjoining contours defining a flanged member receiving slot, portions of said edges adjacent the free ends of said fingers remote from said flange being alternately convergent and divergent to provide a constricted entrance to said slot such that upon forced passage of a member into said slot said fingers will initially flex outwardly and thereafter spring back to snappingly engage the member, said fingers describing a continuous longitudinal arc between their free flange and said ends remote from said flange, whereby upon engagement of said clip with the flanged member the ends of said fingers will bear against the supporting panel and the intermediate portions of the arced fingers will urge the member tightly against the panel.

2. A component mounting installation comprising in combination an apertured supporting member, a heat sink seated in said aperture, and a spring clip securing said sink to said member, said heat sink including a body portion having a continuous internal wall defining a cavity therein, said body portion being disposed at one side of said member, a peripheral flange disposed at the opposite side of said member, and clip engaging means presented externally on said body portion, said clip having a pair of spaced arcuately profiled spring fingers in snapped engagement with said clip engaging means, said spring fingers having end portions which bear against said supporting member, and intermediate portions which are forced against said clip engaging means whereby said peripheral flange is drawn tightly against said opposite surface of said member.

3. A component mounting installation according to claim 2 wherein said clip engaging means is in the form of a plurality of opposed notches disposed on the periphery of said body portion of said heat sink.

4. A component mounting installation according to claim 2 wherein the body portion of said heat sink is externally threaded to provide said clip engaging means.

5. A component mounting installation comprising in combination an apertured supporting member, a heat sink seated in said aperture, said heat sink having a continuous internal wall defining a cavity therein, a fastener securing said sink to said member and means for securing a component associated with said heat sink, said means being in the form of a self-retaining spring seated in said cavity in said heat sink and having component engaging portions spaced from said internal wall defining said cavity and adapted to releasably retain a component in said heat sink.

6. A component mounting installation comprising in combination an apertured supporting member, a heat sink seated in said aperture, a clip securing said sink to said member, and means for securing a component associated with said heat sink, said heat sink including a body portion having a continuous internal wall defining a cavity therein and a flange disposed at one end of said body portion and overlying portions of said member adjacent said aperture, said means being in the form of a self-retaining spring seated in the cavity in said body portion and describing a continuous arc traversing a major portion of the circumference of the internal wall defining said cavity and having component engaging portions spaced from said body portion, said heat sink being retained in said aperture by the co-operative engagement of said clip with said body portion and said member at points spaced from said flange.

References Cited by the Examiner

UNITED STATES PATENTS

| | | | |
|---|---|---|---|
| 1,056,392 | 3/1913 | Barr et al. | 85.8 X |
| 2,861,782 | 11/1958 | Swartz. | |
| 3,213,336 | 10/1965 | McAdam. | |

References Cited by the Applicant

UNITED STATES PATENTS

| | | |
|---|---|---|
| 2,513,637 | 6/1950 | Herreschoff et al. |
| 2,820,925 | 1/1958 | Coy. |
| 2,958,515 | 11/1960 | Booker. |
| 3,033,573 | 5/1962 | Brown. |
| 3,115,805 | 12/1963 | Engelmann. |

ROBERT K. SCHAEFER, *Primary Examiner.*

M. GINSBURG, *Assistant Examiner.*